US008403431B2

(12) United States Patent
Elkins et al.

(10) Patent No.: US 8,403,431 B2
(45) Date of Patent: Mar. 26, 2013

(54) TELECOMMUNICATIONS ENCLOSURES

(75) Inventors: Jin Elkins, Opelika, AL (US);
Christopher S. Whiteside, Midland, GA (US); Hans Bertil Nilsson, Segeltorp (SE)

(73) Assignee: Emerson Network Power, Energy Systems, North America, Inc., Warrenville, IL (US)

( * ) Notice: Subject to any disclaimer, the term of this patent is extended or adjusted under 35 U.S.C. 154(b) by 230 days.

(21) Appl. No.: 12/552,045

(22) Filed: Sep. 1, 2009

(65) Prior Publication Data
US 2011/0050052 A1 Mar. 3, 2011

(51) Int. Cl.
*A47G 29/00* (2006.01)
*A47F 7/00* (2006.01)
(52) U.S. Cl. .................. 312/265.1; 312/265.3; 211/26
(58) Field of Classification Search ............... 211/26; 312/223.1, 265.1–265.4, 296; 174/50, 101; 454/184; 403/170, 171; 361/600, 728, 729, 361/739
See application file for complete search history.

(56) References Cited

U.S. PATENT DOCUMENTS

| | | | | |
|---|---|---|---|---|
| 335,592 A * | 2/1886 | Keyworth | .................... | 285/368 |
| 465,609 A * | 12/1891 | Bunting, Jr. | .................... | 4/430 |
| 822,462 A * | 6/1906 | Martineau et al. | ....... | 137/247.29 |
| 1,045,389 A * | 11/1912 | Gillmor et al. | ................ | 285/368 |
| 1,978,019 A * | 10/1934 | Haushalter | ...................... | 285/55 |
| 3,044,656 A * | 7/1962 | Dobbie et al. | ............... | 220/4.28 |
| 3,087,768 A * | 4/1963 | Mack et al. | ................ | 312/265.4 |
| 3,380,768 A * | 4/1968 | Wolfensberger | ................ | 52/280 |
| 3,973,854 A * | 8/1976 | Gilbo et al. | .................... | 403/170 |
| 4,045,104 A * | 8/1977 | Peterson | .................... | 312/265.4 |
| 4,072,432 A * | 2/1978 | Levy | .................... | 403/170 |
| 4,082,470 A * | 4/1978 | Alberts | .................... | 403/172 |
| 4,101,229 A * | 7/1978 | Weibull | .................... | 403/171 |
| 4,271,654 A * | 6/1981 | Jungbluth | .................... | 52/637 |
| 4,468,067 A * | 8/1984 | Jenkins | .................... | 312/140 |
| 4,544,069 A * | 10/1985 | Cavallini | .................... | 211/183 |
| 4,643,319 A * | 2/1987 | Debus et al. | .................... | 211/189 |
| 4,659,869 A * | 4/1987 | Busby | .................... | 174/354 |
| 4,678,359 A * | 7/1987 | Keen | .................... | 403/170 |
| 4,691,970 A * | 9/1987 | Neri | .................... | 312/265.5 |
| 4,712,695 A * | 12/1987 | Cheng | .................... | 211/191 |
| 4,726,701 A | 2/1988 | Thomas | | |
| 4,768,845 A * | 9/1988 | Yeh | .................... | 312/257.1 |
| 4,869,380 A * | 9/1989 | Metcalfe et al. | .................... | 211/189 |
| 4,900,108 A * | 2/1990 | Tischer | .................... | 312/265.3 |
| 4,922,669 A * | 5/1990 | De Pas et al. | .................... | 52/646 |
| 4,997,240 A | 3/1991 | Schmalzl et al. | | |
| 5,020,866 A * | 6/1991 | McIlwraith | .................... | 312/265.4 |
| 5,147,121 A * | 9/1992 | McIlwraith | .................... | 312/296 |
| 5,202,818 A * | 4/1993 | Betsch et al. | .................... | 361/829 |

(Continued)

FOREIGN PATENT DOCUMENTS
WO 2006/022600 3/2006

*Primary Examiner* — Darnell Jayne
*Assistant Examiner* — Stanton L Krycinski
(74) *Attorney, Agent, or Firm* — Harness, Dickey & Pierce, P.L.C.

(57) ABSTRACT

A telecommunications enclosure includes a frame having a plurality of frame members defining at least one opening. At least one frame member that defines the opening includes a gasket channel positioned on an inner surface of said frame member. The enclosure includes a gasket disposed in the gasket channel and at least one panel coupled to the frame with a retainer. The panel covers the opening in the inner of the enclosure and overlaps an inner surface of the gasket.

21 Claims, 13 Drawing Sheets

U.S. PATENT DOCUMENTS

| | | | |
|---|---|---|---|
| 5,228,762 A * | 7/1993 | Mascrier | 312/265.4 |
| 5,315,794 A | 5/1994 | Pearson | |
| 5,388,903 A * | 2/1995 | Jones et al. | 312/334.29 |
| 5,451,115 A * | 9/1995 | Sayres | 403/171 |
| 5,513,759 A * | 5/1996 | Besserer et al. | 211/189 |
| 5,516,225 A | 5/1996 | Kvols | |
| 5,548,085 A * | 8/1996 | Flores | 174/374 |
| 5,574,257 A * | 11/1996 | Brauer et al. | 174/76 |
| 5,580,181 A * | 12/1996 | Nomura | 403/170 |
| 5,584,406 A * | 12/1996 | Besserer et al. | 211/189 |
| 5,651,630 A * | 7/1997 | Nomura | 403/219 |
| 5,678,375 A * | 10/1997 | Juola | 52/655.1 |
| 5,713,651 A | 2/1998 | Essig et al. | |
| 5,749,476 A * | 5/1998 | Besserer et al. | 211/26 |
| 5,806,946 A * | 9/1998 | Benner et al. | 312/265.3 |
| 5,820,289 A * | 10/1998 | Kern et al. | 403/231 |
| 5,921,052 A * | 7/1999 | Kemp | 52/831 |
| 5,932,843 A * | 8/1999 | Besserer et al. | 174/50 |
| 5,997,117 A * | 12/1999 | Krietzman | 312/265.4 |
| 6,039,420 A | 3/2000 | Besserer et al. | |
| 6,042,202 A * | 3/2000 | Goppion | 312/140 |
| 6,062,664 A * | 5/2000 | Benner | 312/265.1 |
| 6,102,498 A * | 8/2000 | Kohler et al. | 312/223.1 |
| 6,123,400 A * | 9/2000 | Nicolai et al. | 312/265.1 |
| 6,142,594 A * | 11/2000 | Benner et al. | 312/258 |
| 6,149,255 A * | 11/2000 | Benner et al. | 312/265.4 |
| 6,164,737 A * | 12/2000 | Benner et al. | 312/223.1 |
| 6,179,398 B1 * | 1/2001 | Martin | 312/265.4 |
| 6,231,142 B1 * | 5/2001 | Pochet | 312/265.3 |
| 6,238,027 B1 * | 5/2001 | Kohler et al. | 312/265.1 |
| 6,303,854 B1 * | 10/2001 | Papaleo et al. | 174/382 |
| 6,315,132 B1 | 11/2001 | Hartel et al. | |
| 6,347,489 B1 | 2/2002 | Marshall, Jr. et al. | |
| 6,400,567 B1 * | 6/2002 | McKeen et al. | 361/695 |
| 6,428,127 B1 * | 8/2002 | Rasmussen | 312/265.4 |
| 6,533,373 B2 * | 3/2003 | Reuter et al. | 312/223.6 |
| 6,634,512 B2 * | 10/2003 | Knab et al. | 211/189 |
| 6,776,665 B2 | 8/2004 | Huang | |
| 6,791,027 B1 * | 9/2004 | Nicolai et al. | 174/50 |
| 6,792,732 B2 * | 9/2004 | Strassle et al. | 52/655.1 |
| 6,808,240 B2 * | 10/2004 | Altena | 312/265.4 |
| 6,854,238 B2 * | 2/2005 | Boots | 52/655.1 |
| 6,871,902 B2 | 3/2005 | Carson et al. | |
| 6,915,616 B2 * | 7/2005 | Fontana et al. | 52/844 |
| 6,962,262 B2 * | 11/2005 | Toma | 211/182 |
| 6,965,075 B2 * | 11/2005 | Suzuki | 174/50 |
| 7,188,570 B2 * | 3/2007 | Schluter et al. | 109/59 R |
| 7,316,461 B2 * | 1/2008 | Wyatt et al. | 312/352 |
| 7,322,770 B2 * | 1/2008 | Frank | 403/253 |
| 7,427,713 B2 * | 9/2008 | Adducci et al. | 174/50 |
| 7,441,847 B2 * | 10/2008 | Francisquini | 312/265.3 |
| 7,683,270 B2 * | 3/2010 | Fernandez et al. | 174/547 |
| 7,896,177 B1 * | 3/2011 | Toma | 211/182 |
| 7,926,241 B2 | 4/2011 | Schiffmann et al. | |
| 2002/0043388 A1 * | 4/2002 | Ramdohr et al. | 174/50 |
| 2002/0121387 A1 * | 9/2002 | Suzuki et al. | 174/50 |
| 2003/0020382 A1 * | 1/2003 | Herbeck et al. | 312/265.4 |
| 2004/0235319 A1 | 11/2004 | Shimada et al. | |

* cited by examiner

TELECOMMUNICATIONS ENCLOSURES

FIELD

The present disclosure relates to telecommunications enclosures.

BACKGROUND

This section provides background information related to the present disclosure which is not necessarily prior art.

Telecommunications enclosures are often used to house telecommunications equipment. The enclosures may be placed indoors or outdoors. Some known telecommunications enclosures are constructed by welding or gluing enclosure components together. Various techniques have been used for sealing telecommunications enclosures against environmental (e.g., rain, dust, debris, etc.) intrusion into the enclosure.

SUMMARY

This section provides a general summary of the disclosure, and is not a comprehensive disclosure of its full scope or all of its features.

According to one aspect of the present disclosure, a corner copula for a telecommunications enclosure includes a first side having an inner surface and an outer surface. The first side defines a plurality of fastener holes extending from the inner surface to the outer surface. Each fastener hole can receive a fastener for coupling the corner copula to a first frame member. The corner copula includes a second side having an inner surface and an outer surface. The second side defines a plurality of fastener holes extending from the inner surface to the outer surface. Each fastener hole can receive a fastener for coupling the corner copula to a second frame member. The corner copula includes a third side having an inner surface and an outer surface. The third side defines a plurality of fastener holes extending from the inner surface to the outer surface. Each fastener hole can receive a fastener for coupling the corner copula to a third frame member. Each of the sides is generally perpendicular to and intersects the other sides. The corner copula includes a bridge portion along at least part of the inner surfaces of at least two of the sides.

According to another aspect of the present disclosure telecommunications enclosure includes a frame including a plurality of frame members defining at least one opening. A gasket channel is positioned on an inner surface of at least one frame member adjacent the opening. The enclosure includes a gasket disposed in the gasket channel and at least one panel coupled to the frame with a retainer. The panel covers the opening and overlaps an inner surface of the gasket.

According to another aspect of the present disclosure, a telecommunications enclosure includes a plurality of frame members and a plurality of corner connectors connecting the frame members. Each corner connector includes three sides each having an inner and an outer surface. Each side of each corner connector is connected to one of the frame members. The enclosure includes a plurality of gaskets. Each gasket is positioned between the outer surface of one side of a corner connecter and the frame member to which the side of the corner connector is connected.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
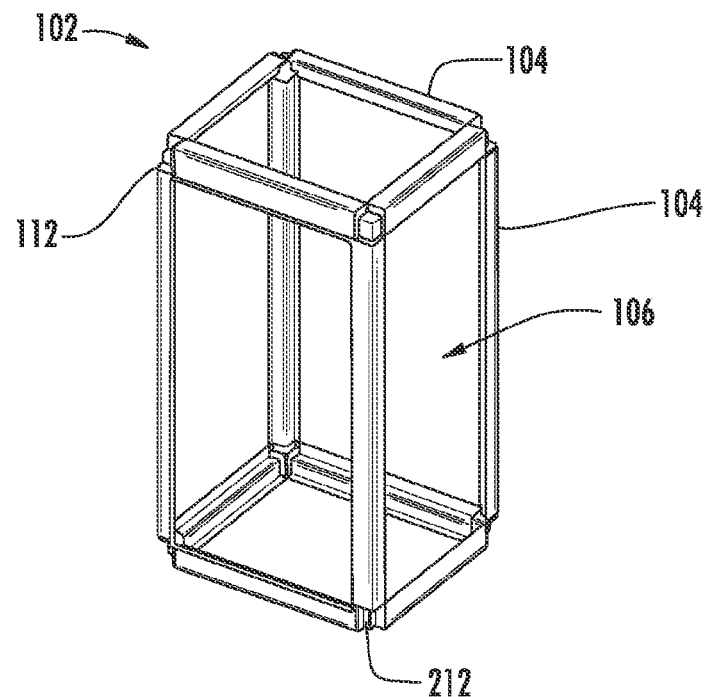
FIG. 1 is an isometric view of a frame for a telecommunications enclosure according to one example embodiment of this disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 2:
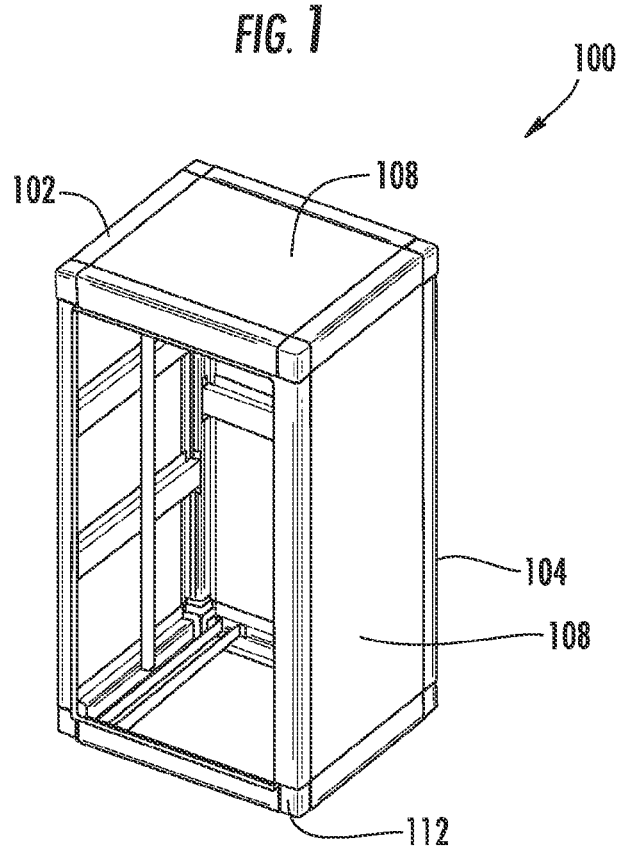
FIG. 2 is a telecommunications enclosure including the frame of FIG. 1.

A telecommunications enclosure, generally indicated by reference numeral 100, according to one aspect of the present disclosure is illustrated in FIGS. 1 and 2. The enclosure 100 includes a frame 102. The frame 102 includes a plurality of frame members 104. The frame members 104 define several openings 106. Panels 108 are attached to the frame members 104 and overlap, i.e. cover, the openings 106.

The frame members 104 may be any suitable length to form an enclosure. Accordingly, a different size enclosure 100 may be constructed simply by using different lengths of frame members 104. The frame members 104 may also be cut to shorter length members from a longer frame member. As will be discussed in more detail below, the frame members 104 may all have the same profile shape, or the enclosure may include frame members 104 with two or more different profiles, as desired.

The frame members 104 are connected together to form the frame 102 using several corner copulas 112. Each corner copula 112 (sometimes referred to as a corner connector) is connected to three frame members 104. The corner copulas 112 are connected to the frame members 104 using fasteners (e.g., screws, bolts, etc.). As can be seen in FIG. 1, a rectangular or square shaped enclosure 100 uses eight horizontal frame members 104 and four vertical frame members 104. These twelve frame members are connected using eight corner copulas 112.

Figure 3:
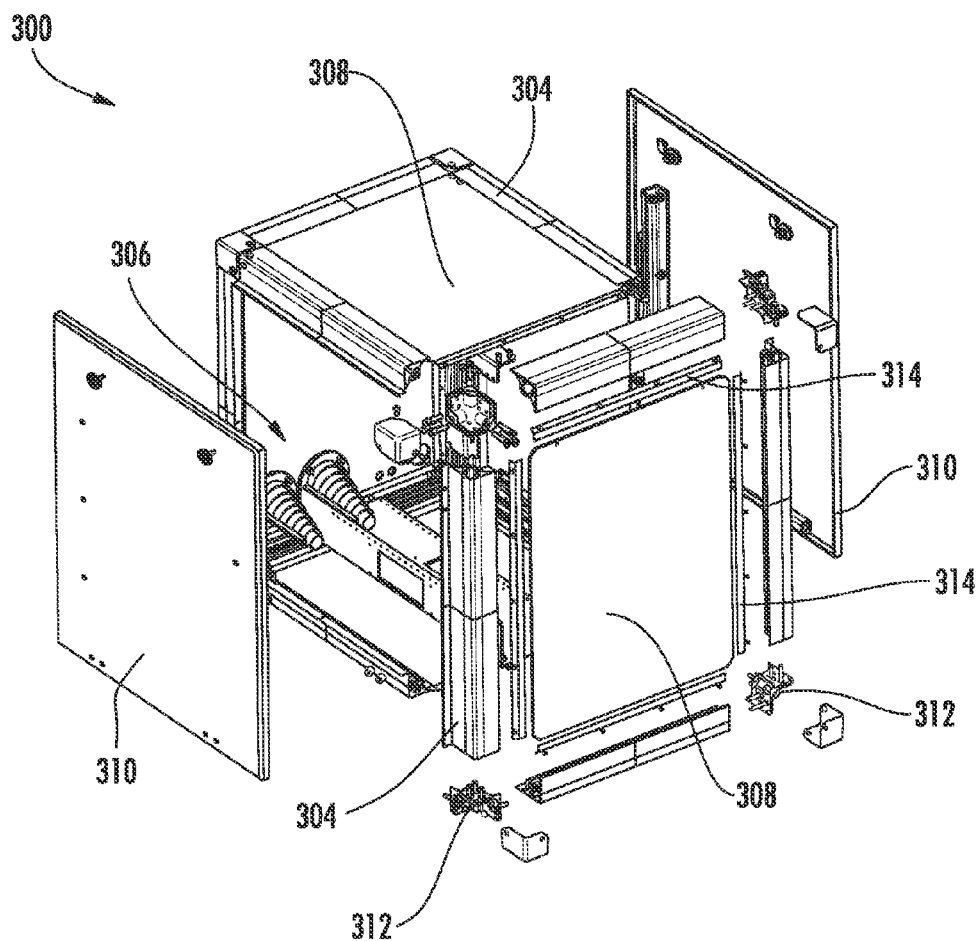
FIG. 3 is a partially exploded view of a telecommunications enclosure according to another example embodiment of this disclosure.

A partially exploded view of another example telecommunications 300 enclosure according to the present disclosure is illustrated in FIG. 3. The enclosure 300 includes a plurality of frame members 304 that define several openings 306. The frame members 304 are connected together by corner copulas 312. Panels 308 are attached to the frame members 304 and cover four of the openings 306. Two of the openings 306 are covered by doors 310. The doors 310 are attached to the frame members 304 and cover the two openings when closed. The doors 310 can be opened to access an interior of the assembled enclosure 300.

Several features of the enclosures 100, 300 contribute to the enclosures 100, 300 being resistant to weather, i.e. weather tight. As will be shown and discussed below, a gasket is positioned between a corner copula 112, 312 and the frame member to which the corner copula 112, 312 is attached. Accordingly, for the enclosure 300, three gaskets are used with each corner copula 312 for a total of twenty-four corner gaskets. Further, the panels 108, 308 attach to the frame members 104, 304 from inside the frame of the enclosure 100, 300. A gasket channel in which a gasket is disposed is located on an interior surface of each frame member 104, 304. Retainers 314 are attached to the frame members 104, 304 to hold the panels 108, 308 in place covering an opening in the enclosure 100, 300. The retainers also bias the panels 108, 308 against the gasket to create a seal around the opening 306.

Figure 4:
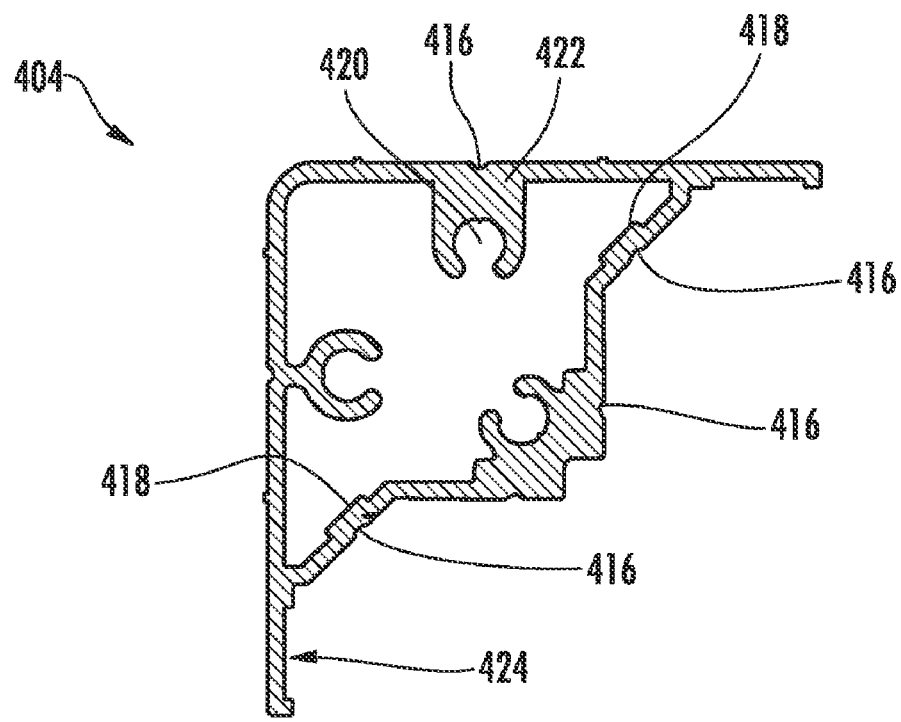
FIG. 4 is a top view of a frame member for a telecommunications enclosure according to another example embodiment of this disclosure.
Figure 5:
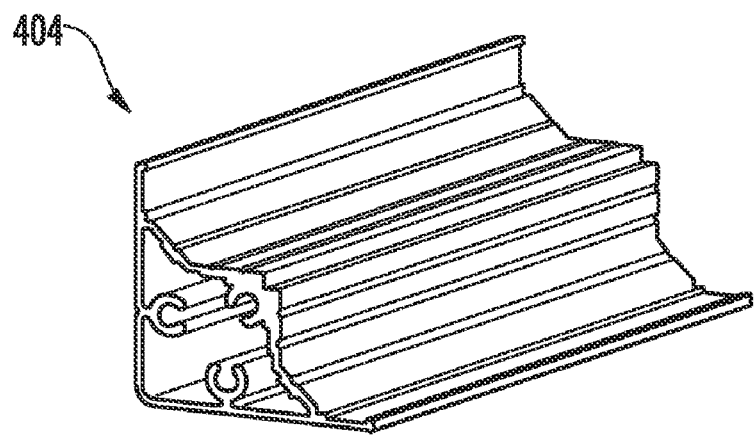
FIG. 5 is an isometric view of the frame member of FIG. 4.
Figure 6:
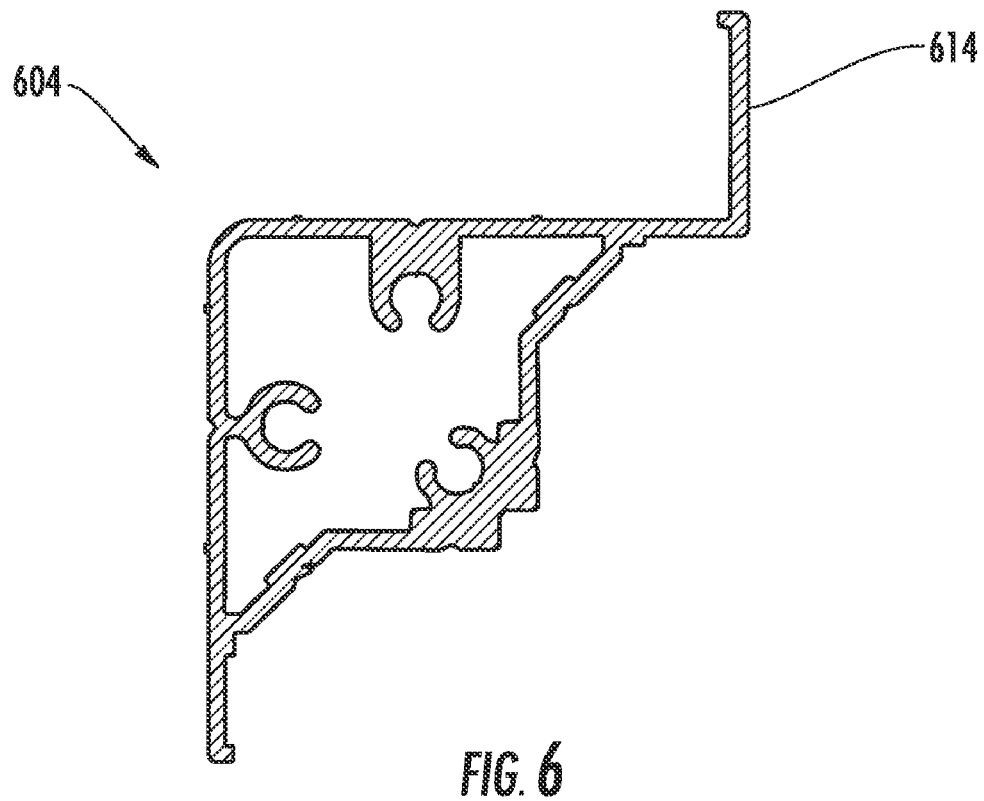
FIG. 6 is a top view of a frame member including a gutter flange for a telecommunications enclosure according to another example embodiment of this disclosure.
Figure 7:
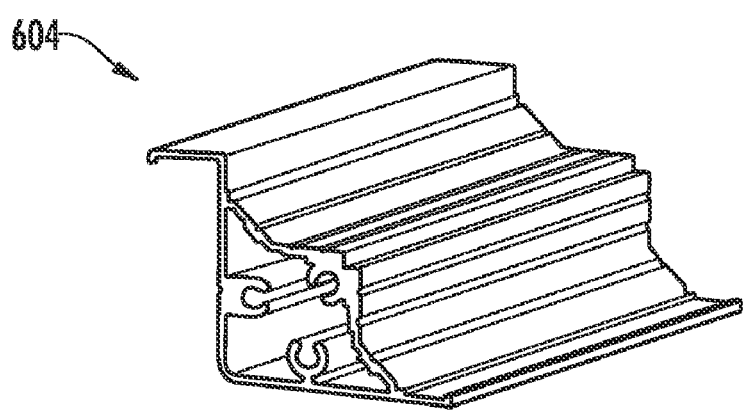
FIG. 7 is an isometric view of the frame member of FIG. 6.
Figure 8:
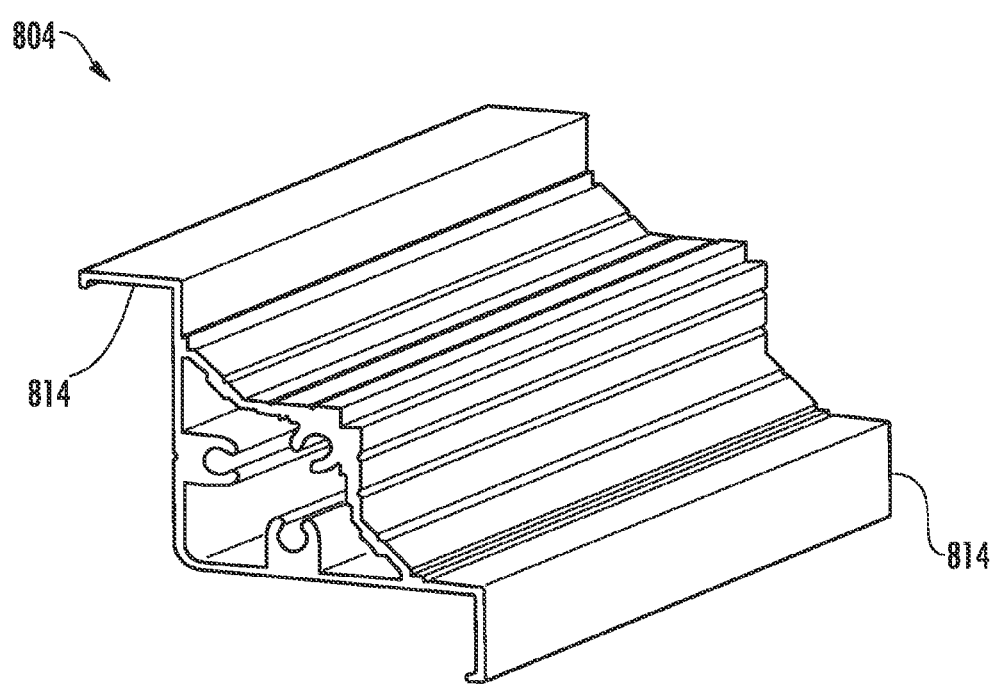
FIG. 8 is a top view of a frame member including two gutter flanges for a telecommunications enclosure according to another example embodiment of this disclosure.

FIGS. 4 through 8 illustrate three example frame members 404, 604, 804 for use in a telecommunications enclosure as described above. FIGS. 4 and 5 illustrate the frame member 404. The frame member 604 in FIGS. 6 and 7 is similar to the frame member 404, but includes a protruding gutter flange 614. The frame member 604 is typically used to define an opening for a door in an enclosure. In an assembled telecomunication enclosure, the gutter flange 614 extends beyond the opening to provide additional protection against water, debris, etc. entering the enclosure. The frame member 804 in FIG. 8 includes two protruding gutter flanges 814. The frame member 804 is typically used in an enclosure with an opening on both sides of the frame member 804 for which a gutter flange 814 is desired.

Several features common to the example frame members 404, 604, 804 will be described with reference to frame member 404. As best shown in FIG. 4, the frame member 404 is a generally triangular profile. The frame member 404 is hollow and in some embodiments is formed by extrusion. Each frame member 404 includes point guides 416. The point guides 416 help guide and align fasteners, e.g., self drilling screws, as the fastener are driven through a part of the frame member 404. The frame member 404 also includes thicker sections 418 located behind the point guides 416 for receiving fasteners driven into the frame member 404 at the locations of the point guides 416. These thicker sections 418 provide additional material and, therefore, allow greater thread engagement of fasteners in these locations. Three fastener bosses 420 permit fasteners to be driven longitudinally into the frame member 404. One or more of the fastener bosses 420 may include a thickened section 422 to provide more material and allow greater thread engagement of fasteners driven into the fastener bosses 420. The frame member 404 also includes a gasket channel 424. As will be described in more detail below, a gasket may be positioned in the gasket channel 424 to seal an interface between a panel and the frame member 404 in a telecommunications enclosure.

The frame members 404, 604, 804 may be constructed of any suitable material. For example, the frame members 404, 604, 804 may be aluminum, steel, etc. The frame members 404, 604, 804 may be made by any suitable process. For example, the frame members may be extruded, cast, molded, machined, welded, or constructed using a combination of the foregoing techniques.

Figure 9:
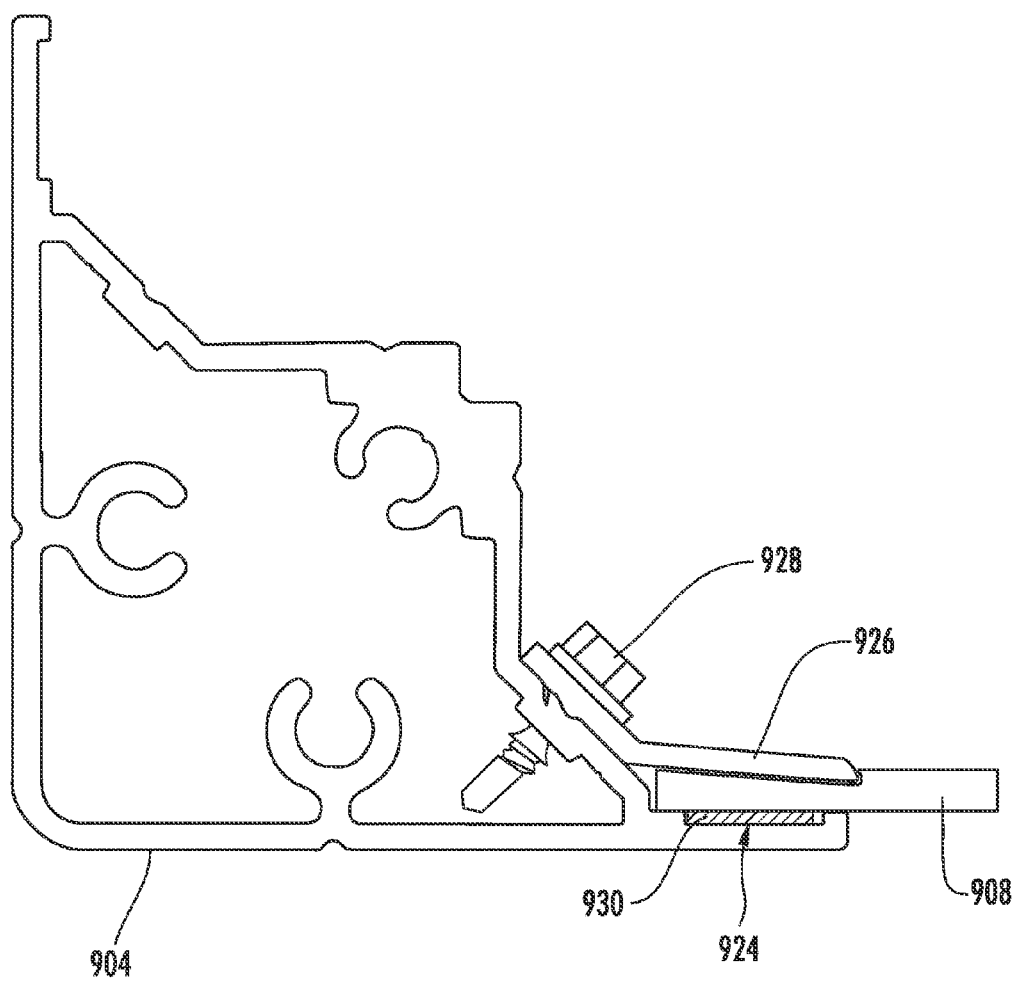
FIG. 9 is a top plan view of a frame member for a telecommunications enclosure according to another example embodiment of this disclosure with a portion of a panel coupled to an interior surface of the frame member.
Figure 10:
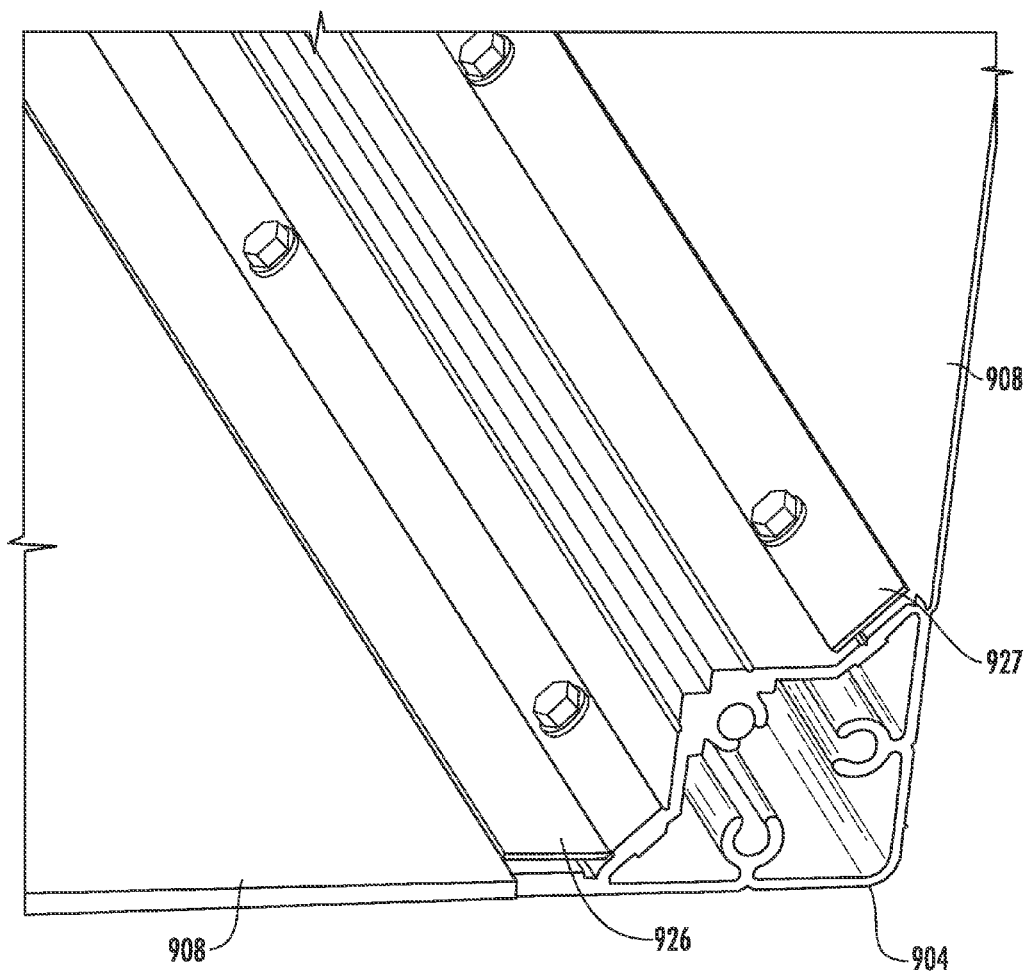
FIG. 10 is an isometric view of a frame member for a telecommunications enclosure according to another example embodiment of this disclosure with a portion of two panels coupled to interior surfaces of the frame member.
Figure 11:
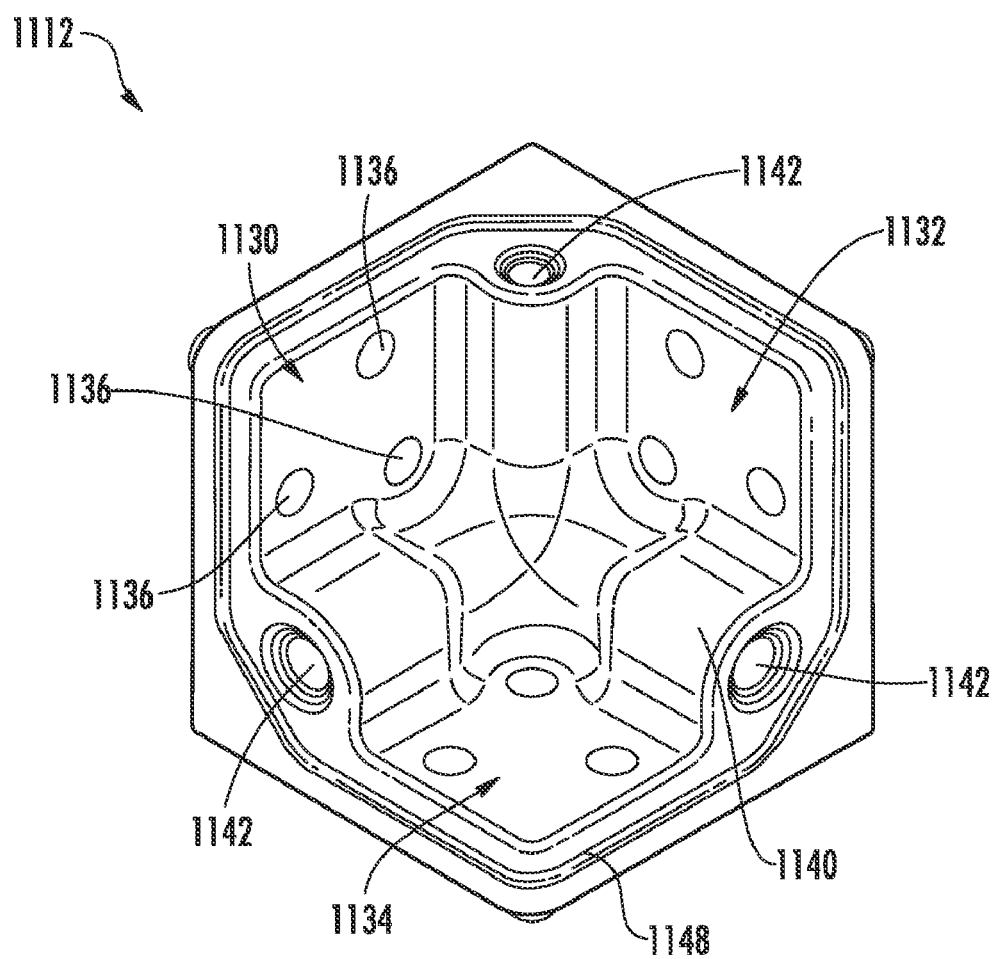
FIG. 11 is an isometric view of inner surfaces of a corner copula for a telecommunications enclosure according to another example embodiment of this disclosure.
Figure 12:
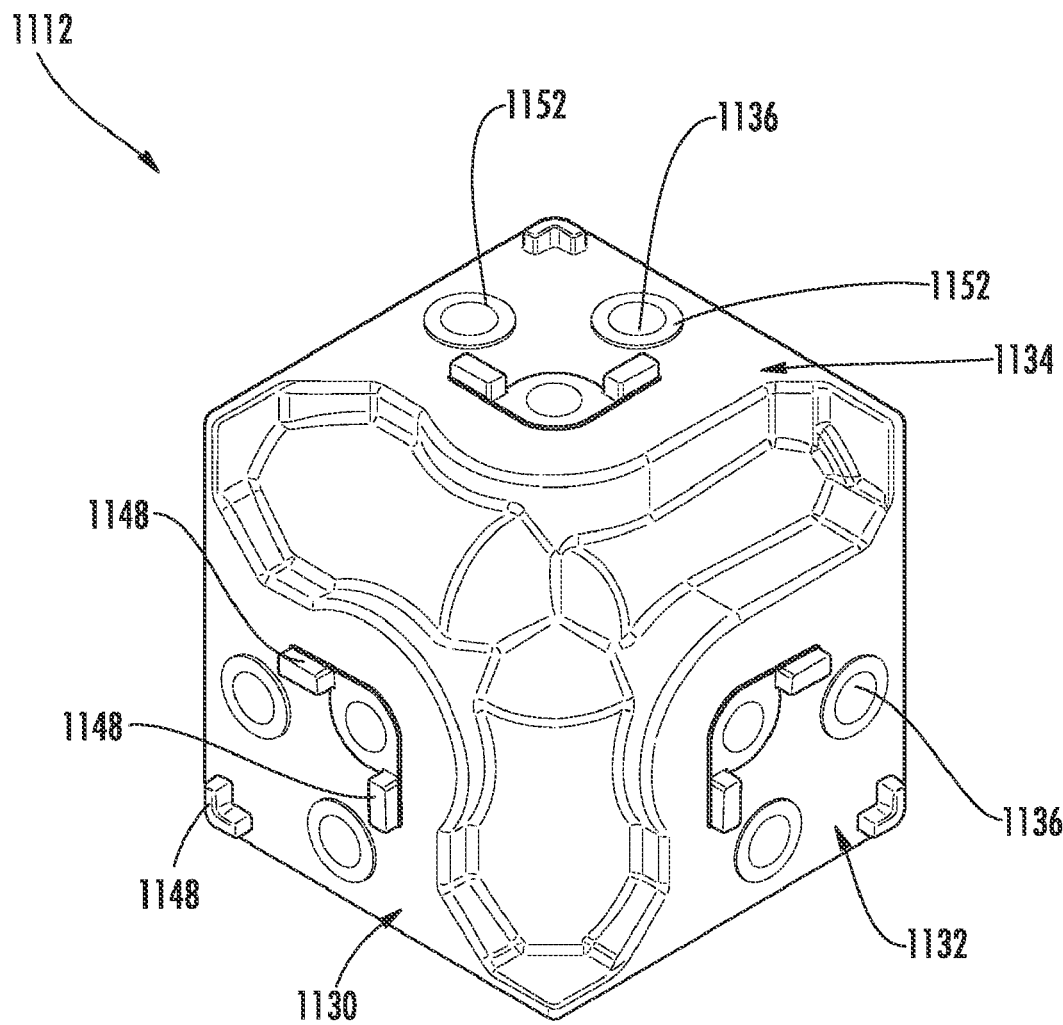
FIG. 12 is an isometric view of outer surfaces of the corner copula of FIG. 11.

As discussed above, panels (such as panels 108, 308) are used to cover openings in the frame of a telecommunications enclosure. The panels are attached to the enclosure on an interior surface of the frame members of the enclosure. One example is illustrated in FIGS. 9 and 10. A panel 908 is attached to a frame member 904 with a retainer 926. The retainer 926 is fastened to an interior portion of the frame member 904 with a fastener 928. A gasket 930 is positioned in the gasket channel 924. The retainer 926 applies a force against the panel 908 and toward the inner surface of the frame member 904 to hold the panel in position and bias the panel 908 against the gasket 930. Accordingly, the interface between the panel 908 and the frame member 904 is substantially sealed.

The retainer 926 may be a discrete retainer as shown in FIGS. 9 and 10. The retainer may also be incorporated (e.g. monolithically formed) into the panel 908 like the retainer 927 shown in FIG. 10.

The panels discussed above may be constructed from any suitable material or combination of materials. The panels can be a single material, single layer composite, laminated material, etc. For example, the panels may be steel, aluminum, wood, etc. The panels can include insulation material (such as, for example extruded polystyrene) laminated between steel, aluminum or other materials. The panel materials can be chosen to obtain various characteristics, such as, for example, EMI shielding, fire resistance, thermal insulation, electrical insulation, resistance to gunfire, capability of supporting equipment mounted to and/or integrated in/on the panel, etc.

One example of a corner copula 1112 according to the present disclosure will now be discussed with reference to FIGS. 11 through 16. In this particular example, the corner copula 1112 is generally shaped as three intersecting perpendicular sides of a cube. The corner copula 1112 includes a first side 1130, a second side 1132, and a third side 1134. Each side 1130, 1132, 1134 includes an inner surface (one of the visible surfaces in FIG. 11) and an outer surface (one of the visible surfaces in FIG. 12). Each side 1130, 1132, 1134 of the corner copula 1112 may be connected to a frame member 1104, thus allowing the corner copula 1112 to connect three frame members 1104.

Each side 1130, 1132, 1134 defines a plurality of fastener holes 1136 extending from the inner surface to the outer surface. Each fastener hole 1136 can receive a fastener 1138 for coupling the corner copula 1112 to a frame member 1104. Accordingly, each frame member 1104 is connected to one side of a corner copula 1112 via three fasteners 1138, (one through each fastener hole 1136 on such side). This evenly distributes the load on the corner copula 1112 and permits smaller fasteners 1138 to be used for connection between the frame members 1104 to the corner copula 1112 (as compared to using only one or two fasteners).

A bridge portion 1140 extends along part of the inner surfaces of the sides 1130, 1132, 1134 of the corner copula 1112. The bridge portion 1140 strengthens the corner copula 1112 and assists in distributing the load on the corner copula 1112. The bridge portion 1140 may be a unitary bridge portion, may be a plurality of bridge portions (such as separate bridge portions between each two perpendicular sides), etc. Further, the bridge portion 1140 may be monolithically formed with the corner copula 1112, separately attached to the corner copula 1112, or some combination of the two.

The corner copula 1112 includes three auxiliary mounts 1142 in the bridge portion 1140. The auxiliary mounts 1142 are adapted to receive auxiliary fasteners. The auxiliary mounts 1142 may be used, for example, to attach an enclosure containing the corner copula 1112 to another enclosure or structure, etc. The auxiliary mounts 1142 may also be used to attach auxiliary items to an enclosure containing the corner copula 1112. For example, the auxiliary mounts 1142 can receive fasteners for attaching a cover (described below), a lifting bracket 1144, etc.

A cover 1146 may be used with the corner copula 1112 (the corner copula 1112 and the cover 1146 sometimes referred to as a corner copula assembly). The cover 1146 is illustrated attached to the corner copula 1112 in FIG. 15. The cover 1146 is substantially shaped as three intersecting perpendicular sides of a cube. When the cover 1146 is coupled to the corner copula 1112, the corner copula assembly is shaped substantially as a cube. The cover 1146 fits in a recess 1148 on the corner copula 1112. The cover 1146 may be attached to the corner copula 1112 by any suitable means, including, for example, by friction fit, using a snap fit, using one or more fasteners inserted into the auxiliary mounts 1142, etc. The cover 1146 covers the otherwise exposed fasteners of the corner copula 1112. Accordingly, the cover 1146 may provide protection from environmental elements (such as rain, dust, debris, etc), limit unauthorized access to the fasteners 1138, and provide a cleaner, more finished appearance.

Figure 13:
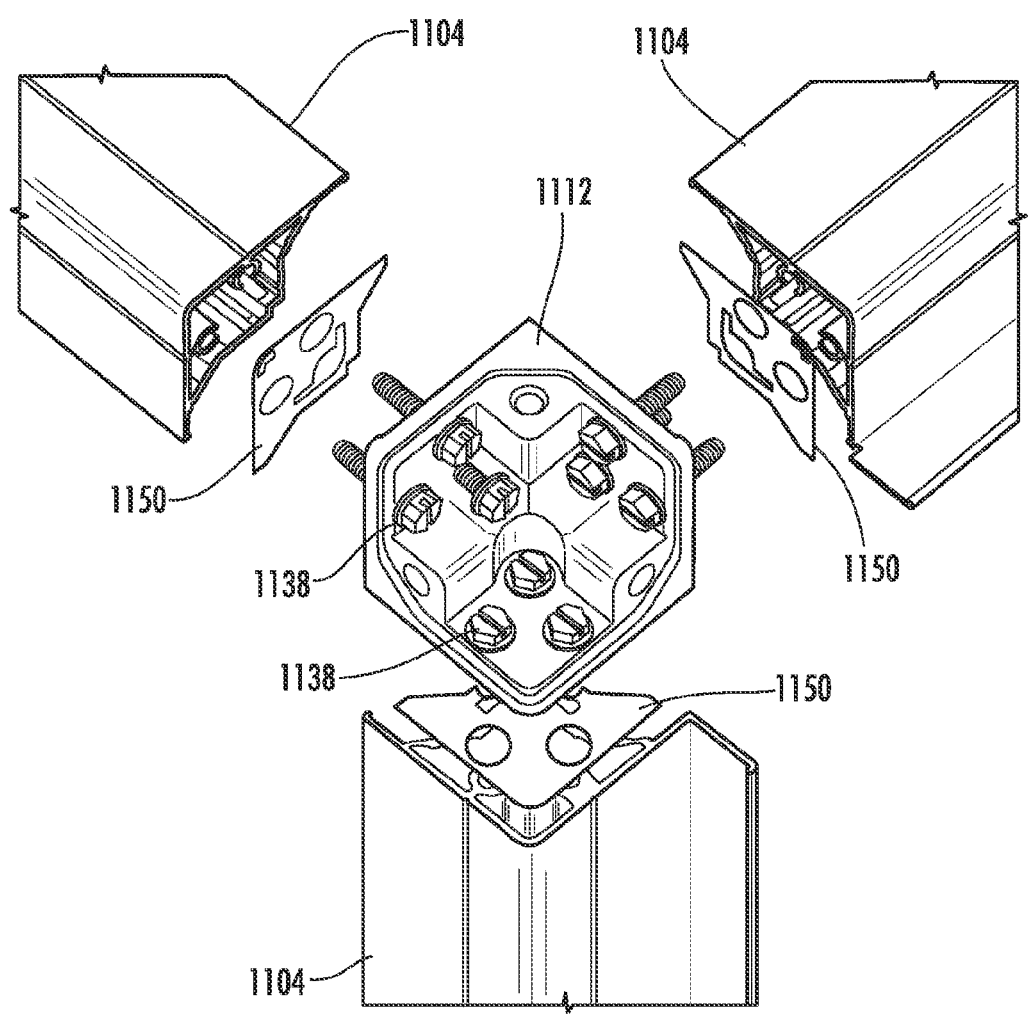
FIG. 13 is an exploded view of a portion of a telecommunications enclosure including a corner copula coupled to three frame members according to another example embodiment of this disclosure.
Figure 14:
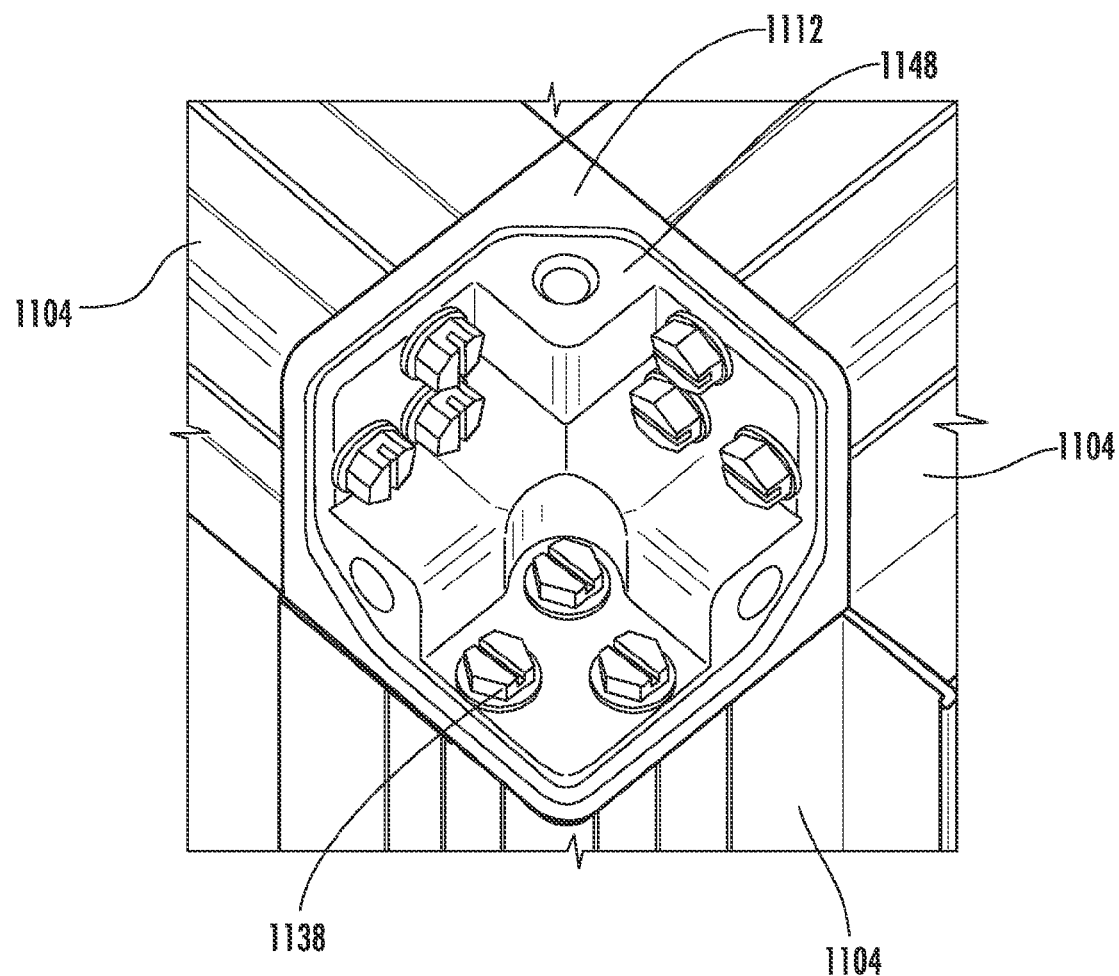
FIG. 14 is an isometric view of a portion of a telecommunications enclosure including a corner copula coupled to three frame members according to another example embodiment of this disclosure.
Figure 15:
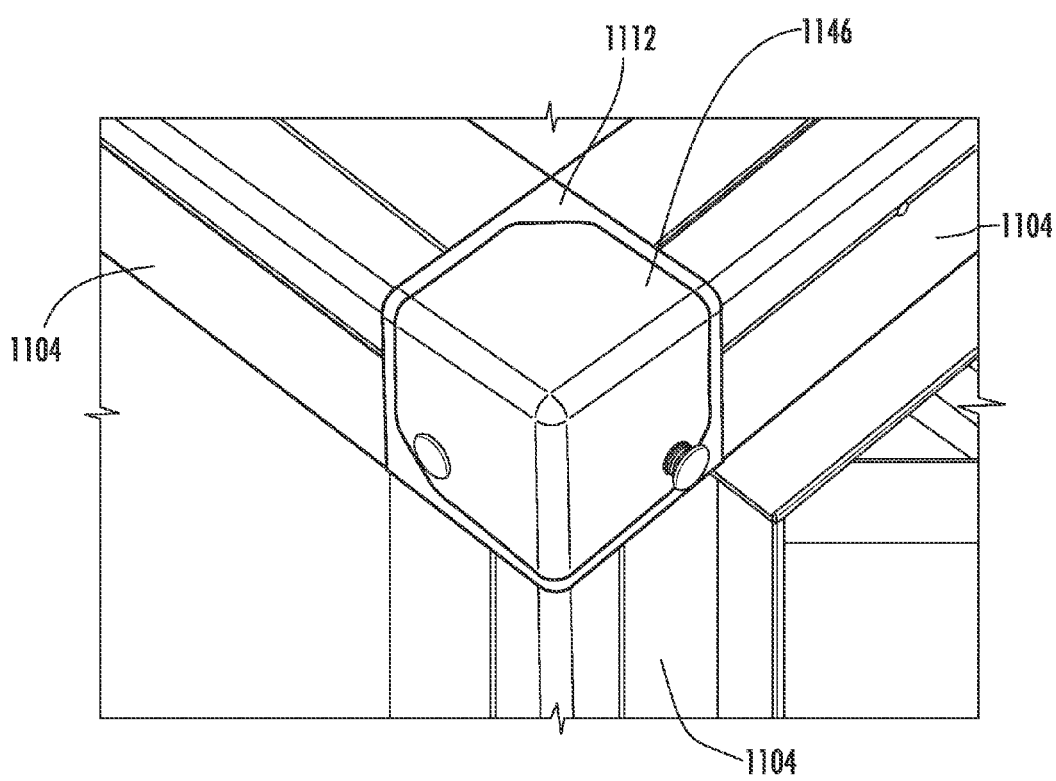
FIG. 15 is an isometric view of a portion of the telecommunications enclosure of FIG. 14 with a cover coupled to the corner copula.
Figure 16:
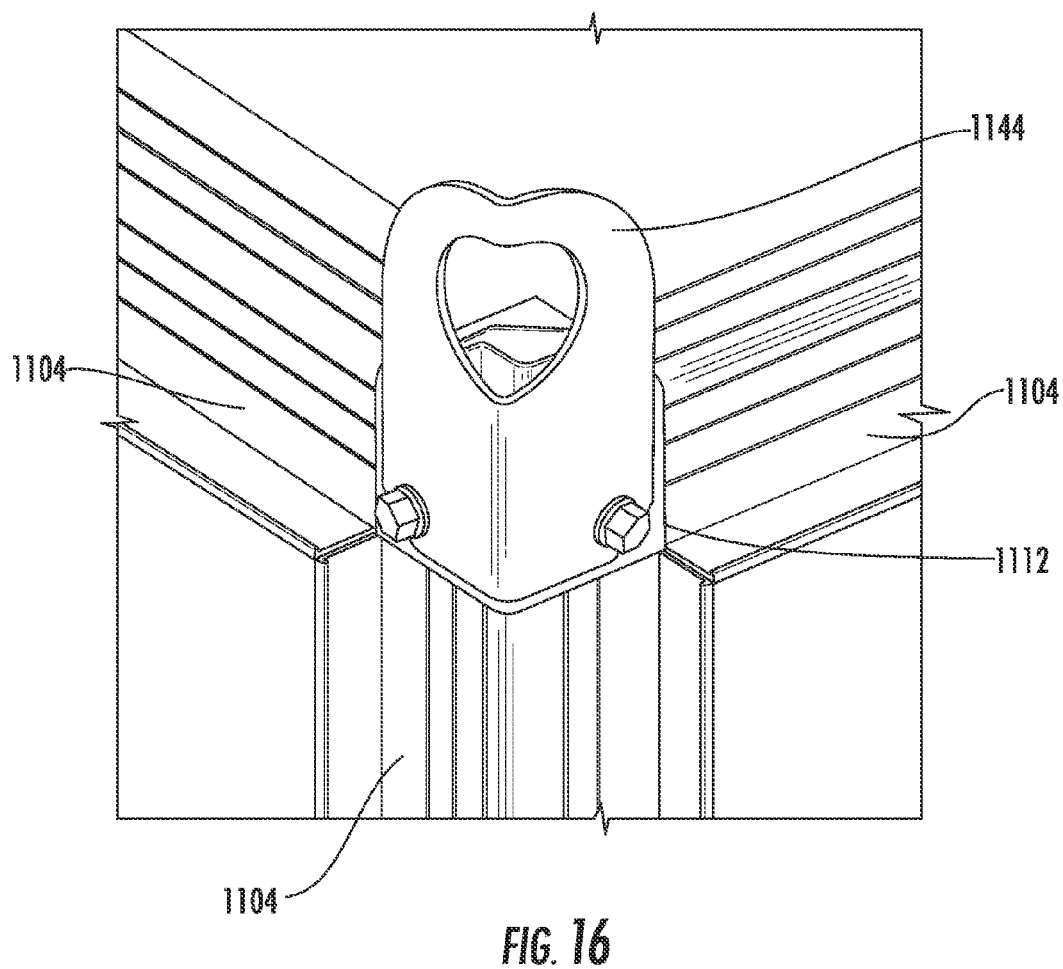
FIG. 16 is an isometric view of a portion of a telecommunications enclosure according to another example embodiment of this disclosure including a corner copula with a lifting bracket mounted to auxiliary mounts of the corner copula.

The outer surfaces of the corner copula 1112 include several features for assembly and sealing of an enclosure including the corner copula 1112. The outer surfaces of the corner copula 1112 can best be seen in FIG. 12. The corner copula 1112 includes tabs 1148 protruding from the outer surface of the sides 1130, 1132, 1134. The tabs 1148 are adapted for engaging an adjacent frame member 1104. The tabs assist in assembly and alignment between the corner copula 1112 and the frame members 1104. When assembling an enclosure, a gasket 1150 is positioned between the corner copula 1112 and a frame member 1104 to be attached to the corner copula 1112 (as best shown in FIG. 13). The outer surfaces of the corner copula 1112 include compression stops 1152 to limit compression of the gasket 1150 when the frame member 1104 is fastened to the corner copula 1112. In the particular example shown in FIG. 12, each compression stop 1152 extends around a fastener hole 1136.

The corner copulas and covers described above may be constructed of any suitable materials. For example, the corner copula may be metal, plastic, fiberglass, etc. The corner copulas and covers may be fabricated by any suitable method, such as casting, molding, machining, stamping, etc. or a combination thereof.

Telecommunications enclosures described above may be used in an interior or exterior location. The enclosures may house any suitable telecommunications equipment, such as, for example, switching equipment, batteries, wireless and wireline communication equipment, power supplies, etc.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A telecommunications enclosure comprising:
a frame defining an interior region for housing telecommunications equipment within the frame, the frame comprising a plurality of frame members defining at least one opening, at least one of the frame members defining the opening including a gasket channel positioned on an inner surface of said frame member facing the interior region of the frame;
a gasket disposed in the gasket channel;
at least one panel covering the opening and overlapping an inner surface of the gasket facing the interior region of the frame; and
a retainer attached to said at least one of the frame members defining the opening and extending along a length of said at least one of the frame members defining the opening, the at least one panel positioned between the retainer and the inner surface of the gasket disposed in the gasket channel, and the retainer configured to bias the at least one panel against the inner surface of the gasket substantially along a length of the gasket to thereby substantially seal an interface between the at least one panel and the at least one of the frame members defining the opening.

2. The enclosure of claim 1 further comprising a door, the door attached to the frame and adapted to cover one of the openings of the frame when the door is closed.

3. The enclosure of claim 2 wherein at least one of the frame members defining the door opening includes a gutter flange.

4. The enclosure of claim 1 wherein the retainer is monolithically formed with the panel.

5. The enclosure of claim 4 wherein the at least one panel is coupled to the frame with a plurality of retainers.

6. The enclosure of claim 5 wherein each of the frame members defining the opening that the panel overlaps includes a gasket channel and a gasket coupled in the gasket channel.

7. The enclosure of claim 1 wherein the retainer is coupled to the frame via screws through the retainer into at least one of the frame members.

8. The enclosure of claim 1 wherein the frame members have a generally triangularly shaped profile.

9. A telecommunications enclosure comprising:
a plurality of frame members;
a plurality of corner connectors connecting the frame members, each corner connector including three sides each having an inner and an outer surface, each of the three sides connected to a different one of the frame members; and
a plurality of gaskets, each gasket positioned between the outer surface of one of the sides of a corner connector and the frame member to which said side of the corner connector is connected;
wherein each corner connector includes at least one compression stop on the outer surface of at least one of the sides, the at least one compression stop protruding away from the outer surface of the at least one of the sides of the corner connector and adapted for limiting compression of the gasket;
wherein at least one compression stop of at least one of the corner connectors extends around a fastener connecting the at least one of the corner connectors to a corresponding frame member.

10. The enclosure of claim 9 wherein each corner connector includes a plurality of tabs on the outer surface of at least one of the sides for engagement with the frame member to which said side of the corner connector is connected.

11. The enclosure of claim 9 wherein the corner connectors are connected to the frame members with removable fasteners.

12. The enclosure of claim 11 wherein three fasteners connect one side of a corner connector to the frame member to which said side is connected.

13. The enclosure of claim 9 wherein the frame members define a plurality of openings and the enclosure further comprises at least one panel covering at least one of the openings and connected to the frame members that define said opening.

14. The enclosure of claim 13 further comprising at least one gasket positioned between the panel and the frame members that define said opening.

15. The enclosure of claim 9 wherein the frame members have a generally triangularly shaped profile.

16. The enclosure of claim 9 further comprising a corner cover, the corner cover removably coupled to one of the corner connectors.

17. The enclosure of claim 16 wherein the corner connector and the corner cover form a substantially cubic shaped corner connector assembly.

18. The enclosure of claim 9 wherein each corner connector includes an auxiliary mount adapted to receive an auxiliary fastener.

19. The enclosure of claim 9 wherein at least one of the plurality of corner connectors includes a bridge portion along at least part of the inner surfaces of at least two of the sides.

20. The enclosure of claim 19 wherein the bridge portion overlaps at least part of the inner surfaces of each of the first side, the second side and the third side of the at least one of the plurality of corner connectors.

21. The enclosure of claim 9 wherein said at least one compression stop of at least one of the corner connectors extends around a fastener hole defined in the at least one of the corner connectors for receiving said fastener connecting the at least one of the corner connectors to a corresponding frame member.

* * * * *